(12) United States Patent
Itayama et al.

(10) Patent No.: US 12,745,565 B2
(45) Date of Patent: Sep. 22, 2026

(54) MANUFACTURING METHOD OF PIEZOELECTRIC ELEMENT, PIEZOELECTRIC ELEMENT, AND LIQUID DROPLET DISPENSING HEAD

(71) Applicant: SEIKO EPSON CORPORATION, Tokyo (JP)

(72) Inventors: Yasuhiro Itayama, Kai (JP); Yasuhiro Horiba, Shiojiri (JP); Masahiro Takeuchi, Chino (JP)

(73) Assignee: SEIKO EPSON CORPORATION (JP)

( * ) Notice: Subject to any disclaimer, the term of this patent is extended or adjusted under 35 U.S.C. 154(b) by 248 days.

(21) Appl. No.: 18/309,864

(22) Filed: May 1, 2023

(65) Prior Publication Data

US 2023/0354711 A1 Nov. 2, 2023

(30) Foreign Application Priority Data

May 2, 2022 (JP) ................................ 2022-075790

(51) Int. Cl.
*H10N 30/00* (2023.01)
*B41J 2/14* (2006.01)
(Continued)

(52) U.S. Cl.
CPC ........ *H10N 30/708* (2024.05); *B41J 2/14233* (2013.01); *B41J 2/161* (2013.01);
(Continued)

(58) Field of Classification Search
CPC .... H10N 30/708; H10N 30/06; H10N 30/079; H10N 30/082; H10N 30/2047;
(Continued)

(56) References Cited

U.S. PATENT DOCUMENTS 6,340,610 B1 1/2002 Ahn et al.
6,502,928 B1 1/2003 Shimada et al.
(Continued)

FOREIGN PATENT DOCUMENTS

EP 0976560 A2 * 2/2000
JP H01-205596 A 8/1989
(Continued)

OTHER PUBLICATIONS

Shimada Masato et al., "Ink Jet Recording Head And Ink Jet Recording Apparatus Comprising The Same" EP 0976560, Feb. 2, 2000, [Paragraphs 0128, 0140, 0228] (Year: 2000).*
(Continued)

*Primary Examiner* — Lisa Solomon
(74) *Attorney, Agent, or Firm* — Harness, Dickey & Pierce, P.L.C.

(57) ABSTRACT

A manufacturing method of a piezoelectric element includes: forming a first conductive film on a vibration plate as a substrate; etching a first conductive film; forming a second conductive film on the first conductive film; etching the second conductive film to form a first electrode having a step region as a step formed by the second conductive film and the first conductive film at ends thereof; forming a seed layer as an orientation control layer covering the first electrode by a liquid phase method; forming a piezoelectric film on the seed layer; etching the piezoelectric film to form a piezoelectric body; and forming a second electrode covering the piezoelectric body.

9 Claims, 14 Drawing Sheets

(51) Int. Cl.

| | |
|---|---|
| ***B41J 2/16*** | (2006.01) |
| ***H10N 30/06*** | (2023.01) |
| ***H10N 30/079*** | (2023.01) |
| ***H10N 30/082*** | (2023.01) |
| ***H10N 30/20*** | (2023.01) |
| ***H10N 30/87*** | (2023.01) |

(52) U.S. Cl.

CPC ............ *B41J 2/1626* (2013.01); *H10N 30/06* (2023.02); *H10N 30/079* (2023.02); *H10N 30/082* (2023.02); *H10N 30/2047* (2023.02); *H10N 30/87* (2023.02)

(58) Field of Classification Search

CPC . H10N 30/87; H10N 30/8542; B41J 2/14233; B41J 2/161; B41J 2/1626; B41J 2002/14419; B41J 2002/14491; B41J 2/1631; B41J 2/1642; B41J 2/1645; B41J 2/1646

See application file for complete search history.

(56) References Cited

U.S. PATENT DOCUMENTS

| | | | |
|---|---|---|---|
| 2009/0140438 A1 | 6/2009 | Yamazaki et al. | |
| 2014/0368583 A1* | 12/2014 | Morozumi | H10N 30/8554 310/365 |
| 2018/0138393 A1 | 5/2018 | Sumi et al. | |

FOREIGN PATENT DOCUMENTS

| | | | | |
|---|---|---|---|---|
| JP | 2000-198197 | A | | 7/2000 |
| JP | 2006-254295 | A | | 9/2006 |
| JP | 2009-290223 | A | | 12/2009 |
| JP | 2012089600 | A | * | 5/2012 |
| JP | 2012-174859 | A | | 9/2012 |
| JP | 2018-082052 | A | | 5/2018 |
| JP | 2019-008298 | A | | 1/2019 |
| JP | 2020155575 | A | * | 9/2020 |

OTHER PUBLICATIONS

Itayama Yasuhiro et al., “Piezoelectric Element, Liquid Droplet Injection Head, and Liquid Droplet Injection Device, and Manufacturing Method of Piezoelectric Element” JP 2012089600, May 10, 2012, [Description of Embodiment] (Year: 2012).*

Ueda Keiji et al., “Precursor Fluid for Film Formation and Method for Producing the Same, Ferroelectric Composite Oxide Thin Film, Piezoelectric Element, and Electronic Apparatus” (JP 2020155575 A), Sep. 4, 2020, [Description of Embodiments] (Year: 2020).*

* cited by examiner 44
440
444
443
VI
442
441
362
36
361
34
C
32

443
442
36
441
VII
T
S
F
+Y
-Y
+Z
-Z
-X

MANUFACTURING METHOD OF PIEZOELECTRIC ELEMENT, PIEZOELECTRIC ELEMENT, AND LIQUID DROPLET DISPENSING HEAD

The present application is based on, and claims priority from JP Application Serial Number 2022-075790, filed May 2, 2022, the disclosure of which is hereby incorporated by reference herein in its entirety.

BACKGROUND

1. Technical Field

The present disclosure relates to a manufacturing method of a piezoelectric element, a piezoelectric element, and a liquid droplet dispensing head.

2. Related Art

As a liquid droplet dispensing head which is one of devices using a piezoelectric element, for example, a liquid droplet ejection head used in an ink jet printer disclosed in JP-A-2012-89600 is known.

The liquid droplet ejection head includes a flow path forming substrate in which a pressure chamber communicating with a nozzle is formed, and a piezoelectric element provided on one surface side of the flow path forming substrate via a vibration plate, and dispenses ink droplets from the nozzle by causing a pressure change in an ink in the pressure chamber by the piezoelectric element.

In order to control a crystal orientation of a piezoelectric layer, the piezoelectric element includes an orientation control layer formed between a first electrode and the piezoelectric layer so as to cover the first electrode.

In JP-A-2012-89600, the orientation control layer is formed by an ink jet method in which a precursor solution of the orientation control layer is dropped.

When a film thickness of the orientation control layer is increased, a thickness of the piezoelectric layer disposed between the first electrode and a second electrode is relatively reduced. Therefore, piezoelectric characteristics of the piezoelectric element may deteriorate. On the other hand, when a film thickness of the orientation control layer is reduced, if the orientation control layer is formed by a liquid phase method, a corner portion of an end of the first electrode may be too thin or the film may not be formed at the corner portion.

Further, when the orientation control layer is not formed at the corner portion of the end of the first electrode, the piezoelectric layer may grow in an unintended crystal orientation, a defect such as a crack may be generated in the piezoelectric layer, and the piezoelectric characteristics may deteriorate.

SUMMARY

A manufacturing method of a piezoelectric element according to an aspect of the present disclosure includes: forming a first conductive film on a substrate; etching the first conductive film; forming a second conductive film on the first conductive film; etching the second conductive film to form a first electrode having a step formed by the second conductive film and the first conductive film at ends thereof; forming an orientation control layer covering the first electrode by a liquid phase method; forming a piezoelectric film on the orientation control layer; etching the piezoelectric film to form a piezoelectric body; and forming a second electrode covering the piezoelectric body.

A manufacturing method of a piezoelectric element according to an aspect of the present disclosure includes: forming a first conductive film on a substrate; forming a first electrode by etching the first conductive film to have a step at an end of the first conductive film; forming an orientation control layer covering the first electrode; forming a piezoelectric film on the orientation control layer; etching the piezoelectric film to form a piezoelectric body; and forming a second electrode covering the piezoelectric body.

A piezoelectric element according to an aspect of the present disclosure includes: a first electrode; an orientation control layer provided on the first electrode; a piezoelectric body provided on the orientation control layer and containing potassium, sodium, and niobium; and a second electrode provided on the piezoelectric body. The first electrode has a flat region and an inclined region, and the first electrode has a step region between the flat region and the inclined region.

A liquid droplet dispensing head according to an aspect of the present disclosure includes: the above-described piezoelectric element; a voltage application unit configured to apply a voltage to the piezoelectric element; a pressure chamber substrate provided with a pressure chamber whose volume is changed by the piezoelectric element; a flow path substrate provided with a communication flow path communicating with the pressure chamber; and a nozzle plate provided with a nozzle communicating with the communication flow path.

DESCRIPTION OF EXEMPLARY EMBODIMENTS

Hereinafter, embodiments according to the present disclosure will be described with reference to the drawings.

Here, in each of the following drawings, in order to make each member have a recognizable size, a scale of each member is made different from an actual scale.

In each drawing, an X axis, a Y axis, and a Z axis orthogonal to one another are appropriately described. A direction along the X axis is defined as an X-direction. A direction along the Y axis is defined as a Y-direction. A direction along the Z axis is defined as a Z-direction. When the directions of the X-direction, the Y-direction, and the Z-direction are identified, a positive direction is defined as "+" and a negative direction is defined as "−", and positive and negative symbols are used in combination in the direction notation.

In the embodiment, when a plane including the X axis and the Y axis is an XY plane, viewing the XY plane in the Z-direction is referred to as a "plan view" or "planar", and viewing the XY plane in a direction perpendicular to a cross section including the Z axis is referred to as a "cross-sectional view" or "cross-sectional".

Further, in the following description, for example, a description "an element B is provided on an element A" indicates any one of a case where the element B is provided in contact with the element A, a case where the element B is provided with another element C or the like interposed between the element B and the element A, and a case where a part of the element B is provided in contact with the element A and the remaining part of the element B is provided with another element C or the like interposed between the element B and the element A.

Further, in the following description, the specific dimensions of each of the configurations described will be described as a preferable application example, whereas the configuration of the present disclosure is not limited to the described dimensions.

1. Configuration of Liquid Droplet Dispensing Device

Figure 1:
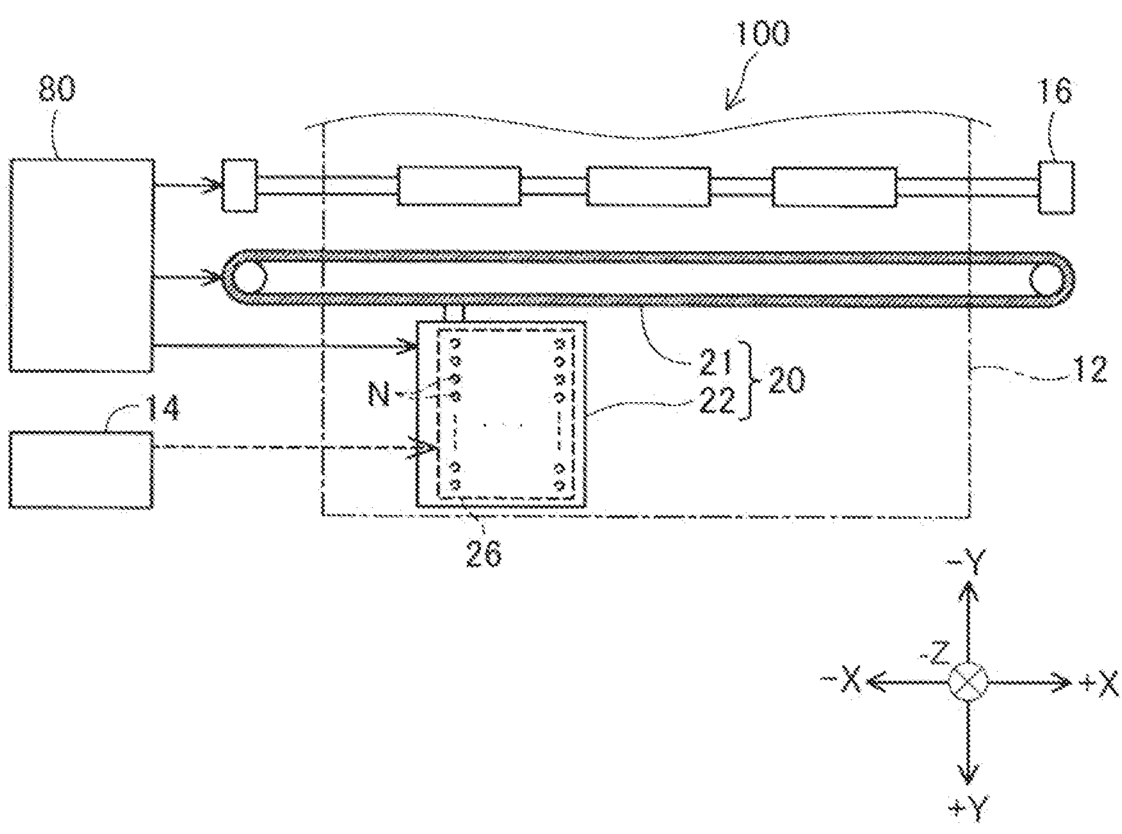
FIG. 1 is a schematic diagram showing a schematic configuration of a liquid droplet dispensing device.

A configuration of a liquid droplet dispensing device 100 will be described with reference to FIG. 1. FIG. 1 is a schematic diagram showing a schematic configuration of a liquid droplet dispensing device according to an embodiment.

The liquid droplet dispensing device 100 is an ink jet printing device that performs printing by dispensing liquid droplets of an ink as a liquid onto a medium 12.

As the medium 12, in addition to a piece of printing paper, a printing target of any material such as a resin film or cloth can be adopted.

The liquid droplet dispensing device 100 includes a liquid droplet dispensing head 26, a head moving mechanism 20, a liquid accommodation unit 14, a conveyance mechanism 16, and a control unit 80.

A main scanning direction, which is a moving direction of the liquid droplet dispensing head 26, is the X-direction, a sub-scanning direction, which is a feeding direction of the medium 12, is the Y-direction, and an ink dispensing direction of the liquid droplet dispensing head 26 is a −Z-direction.

The liquid accommodation unit 14 accommodates the ink to be supplied to the liquid droplet dispensing head 26.

As the liquid accommodation unit 14, a bag-shaped liquid pack formed of a flexible film, an ink tank which can be replenished with the ink, a detachable ink cartridge, or the like can be used.

The liquid droplet dispensing head 26 has a plurality of nozzles N for dispensing the ink.

The plurality of nozzles N are arranged in the Y-direction. The liquid droplet dispensing head 26 dispenses the ink supplied from the liquid accommodation unit 14 from the plurality of nozzles N toward the medium 12.

The head moving mechanism 20 includes a conveyance belt 21 and a carriage 22 that accommodates the liquid droplet dispensing head 26.

The carriage 22 is coupled to the conveyance belt 21 and reciprocates in the X-direction as the conveyance belt 21 is driven.

The conveyance mechanism 16 conveys the medium 12 in the Y-direction.

The control unit 80 includes a processing circuit such as a central processing unit (CPU) and a field programmable gate array (FPGA), and a storage circuit such as a semiconductor memory, and controls an overall operation of the liquid droplet dispensing device 100.

The control unit 80 is electrically coupled to the conveyance mechanism 16, the head moving mechanism 20, and the liquid droplet dispensing head 26, and controls each unit. Under the control of the control unit 80, the conveyance mechanism 16 conveys the medium 12, and the liquid droplet dispensing heads 26 dispense the ink from the nozzles N. Therefore, a desired image is printed on the medium 12.

2. Configuration of Liquid Droplet Dispensing Head

Figure 2:
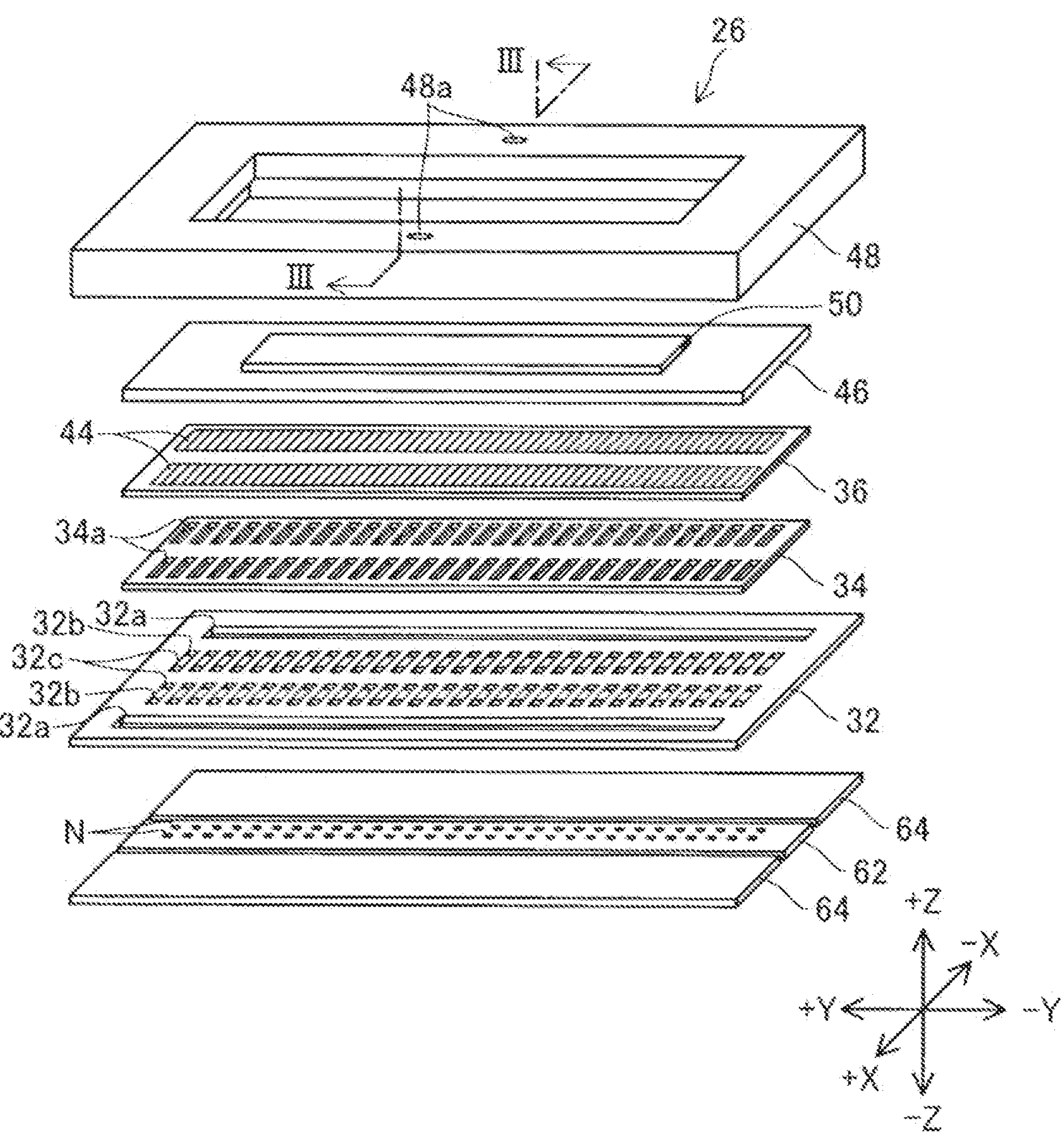
FIG. 2 is an exploded perspective view of a liquid droplet dispensing head.
Figure 3:
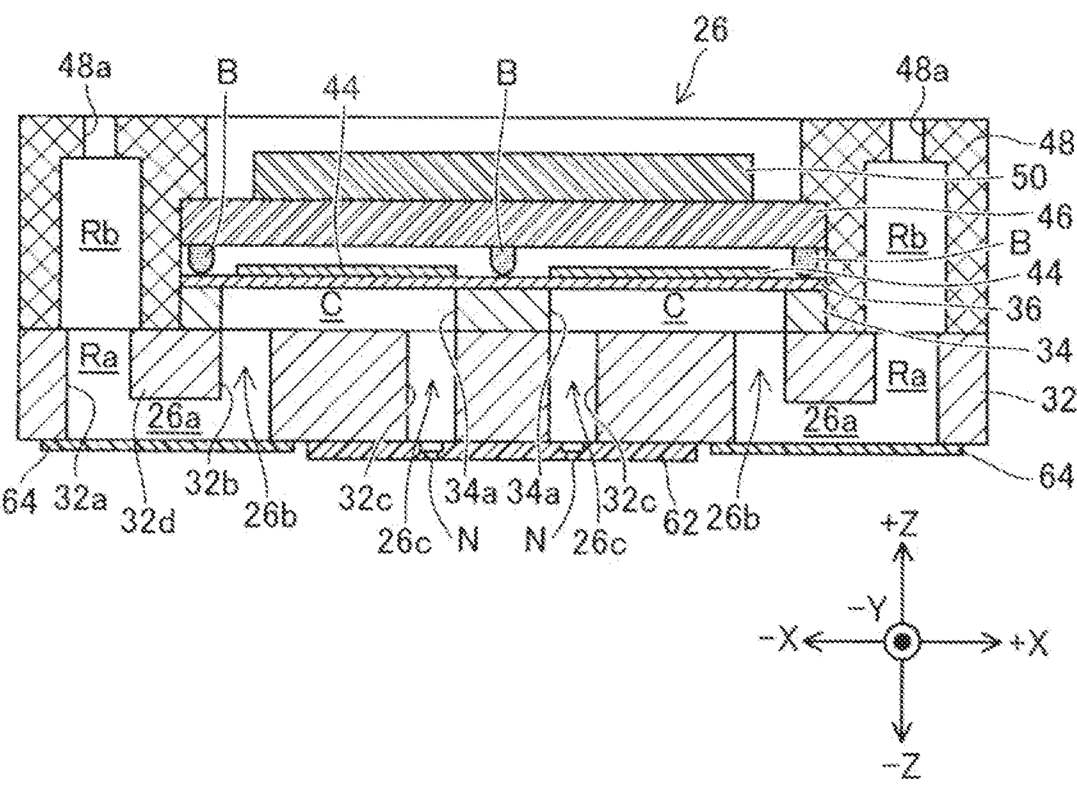
FIG. 3 is a cross-sectional view taken along a line III-III in FIG. 2.

Next, a configuration of the liquid droplet dispensing head 26 will be described with reference to FIGS. 2 and 3. FIG. 2 is an exploded perspective view of the liquid droplet dispensing head 26. FIG. 3 is a cross-sectional view taken along a line III-III in FIG. 2.

As shown in FIG. 2, the liquid droplet dispensing head 26 includes a nozzle plate 62, two vibration absorbers 64, a flow path substrate 32, a pressure chamber substrate 34, a vibration plate 36 as a substrate, a wiring substrate 46, a drive circuit 50 as a voltage application unit, and a housing 48.

The nozzle plate 62, the vibration absorber 64, the flow path substrate 32, the pressure chamber substrate 34, the vibration plate 36, and the wiring substrate 46 are plate-shaped members elongated in the Y-direction.

The nozzle plate 62, the flow path substrate 32, the pressure chamber substrate 34, and the vibration plate 36 each have a substantially line-symmetrical structure with respect to a center line in the X-direction.

Sizes of planar shapes of the pressure chamber substrate 34, the vibration plate 36, and the wiring substrate 46 are smaller than sizes of planar shapes of the flow path substrate 32 and the housing 48.

The nozzle plate 62, the two vibration absorbers 64, the flow path substrate 32, the pressure chamber substrate 34, the vibration plate 36, the wiring substrate 46, and the housing 48 are combined with one another via, for example, an adhesive.

The nozzle plate 62 is a plate-shaped member in which a plurality of nozzles N are formed. The nozzle N is a through hole having a substantially circular planar shape. The plurality of nozzles N are arranged along the Y-direction. The plurality of nozzles N are arranged in two rows in the X-direction.

The two vibration absorbers 64 are flexible films, and are disposed in the X-direction with the nozzle plate 62 interposed therebetween.

The flow path substrate 32 includes two first openings 32*a*, a plurality of second openings 32*b*, and a plurality of third openings 32*c*.

A shape of the first opening 32*a* is a rectangle elongated in the Y-direction in a plan view.

The plurality of second openings 32*b* are arranged in the Y-direction.

The plurality of third openings 32*c* are arranged in the Y-direction.

In the X-direction of the flow path substrate 32, the first opening 32*a*, the second opening 32*b*, the third opening 32*c*, the third opening 32*c*, the second opening 32*b*, and the first opening 32*a* are provided in this order. The second openings 32*b* and the third openings 32*c* adjacent to each other in the X-direction are provided so that positions thereof in the Y-direction are substantially the same.

A plurality of openings 34*a* are formed in the pressure chamber substrate 34.

A shape of the opening 34*a* is a rectangle elongated in the X-direction in a plan view.

The plurality of openings 34*a* are arranged adjacent to each other in the Y-direction and the X-direction. The openings 34*a* are provided at positions overlapping the second openings 32*b* and the third openings 32*c* adjacent to each other in the flow path substrate 32 in a plan view.

Piezoelectric elements 44 are provided on the vibration plate 36. The piezoelectric elements 44 are provided at positions overlapping the openings 34*a* of the pressure chamber substrate 34 in a plan view. The openings 34*a* constitute a part of a pressure chamber to be described later.

The drive circuit 50 drives the piezoelectric elements 44. The drive circuit 50 is implemented by an integrated circuit (IC) chip that outputs a drive signal for driving the piezoelectric elements 44 and a reference voltage. The drive circuit 50 is mounted on the wiring substrate 46.

The wiring substrate 46 is provided with terminals and wirings for an input signal to the drive circuit 50, a drive signal output from the drive circuit 50, and the reference voltage.

As shown in FIG. 3, terminals of the wiring substrate 46 are coupled to the piezoelectric elements 44 via bumps B and the wirings on the vibration plate 36. Flexible printed circuits (FPC) or the like (not shown) are coupled to the terminals of the wiring substrate 46 to supply an input signal to the drive circuit 50.

The housing 48 is a case that accommodates a substrate and an ink. The pressure chamber substrate 34, the vibration plate 36, and the wiring substrate 46 are disposed in an internal space of the housing 48.

Through holes 48*a* and spaces Rb communicating with the through holes 48*a* and extending in the Y-direction are provided at both ends of the housing 48 in the X-direction. The spaces Rb of the housing 48 constitute a part of a liquid storage chamber that stores the ink.

The flow path substrate 32 is provided with spaces Ra, supply liquid chambers 26*a*, and supply flow paths 26*b*.

The space Ra is an internal space of the first opening 32*a* of the flow path substrate 32, and the supply flow path 26*b* is an internal space of the second opening 32*b*. The supply liquid chamber 26*a* is a space that communicates with the space Ra and the supply flow path 26*b*, and is a space surrounded by a partition wall 32*d* of the flow path substrate 32 and the vibration absorber 64.

Pressure chambers C are provided in the pressure chamber substrate 34.

The pressure chamber C is a space surrounded by the opening 34*a* of the pressure chamber substrate 34, the vibration plate 36, and the flow path substrate 32. The pressure chamber C communicates with the supply flow path 26*b* and a communication flow path 26*c* of the flow path substrate 32.

The communication flow path 26*c* is an internal space of the third opening 32*c*. The communication flow path 26*c* communicates with the pressure chamber C and the nozzle N of the nozzle plate 62.

The space Ra and the space Rb function as liquid storage chambers that store the ink to be supplied to the pressure chamber C.

The space Rb communicates with a plurality of spaces Ra arranged in the Y-direction, and the ink to be supplied through the through hole 48*a* is stored in the plurality of spaces Ra through the space Rb.

The ink stored in the space Ra flows through the supply liquid chamber 26*a* and the supply flow path 26*b* and is supplied to the pressure chamber C.

The piezoelectric elements 44 are disposed at positions overlapping the pressure chambers C in a +Z-direction.

The wiring substrate 46 and the drive circuit 50 are disposed to cover the two piezoelectric elements 44.

The drive signal and the reference voltage are supplied to the piezoelectric elements 44 from the drive circuit 50 via the bumps B and the wiring substrate 46. When the drive signal and the reference voltage are input to the piezoelectric element 44, the piezoelectric element 44 is deformed. The vibration plate 36 vibrates in conjunction with the deformation of the piezoelectric element 44, and pressure in the pressure chamber C fluctuates. Therefore, the ink is dispensed from the nozzle N.

3. Configuration of Piezoelectric Element

Figure 4:
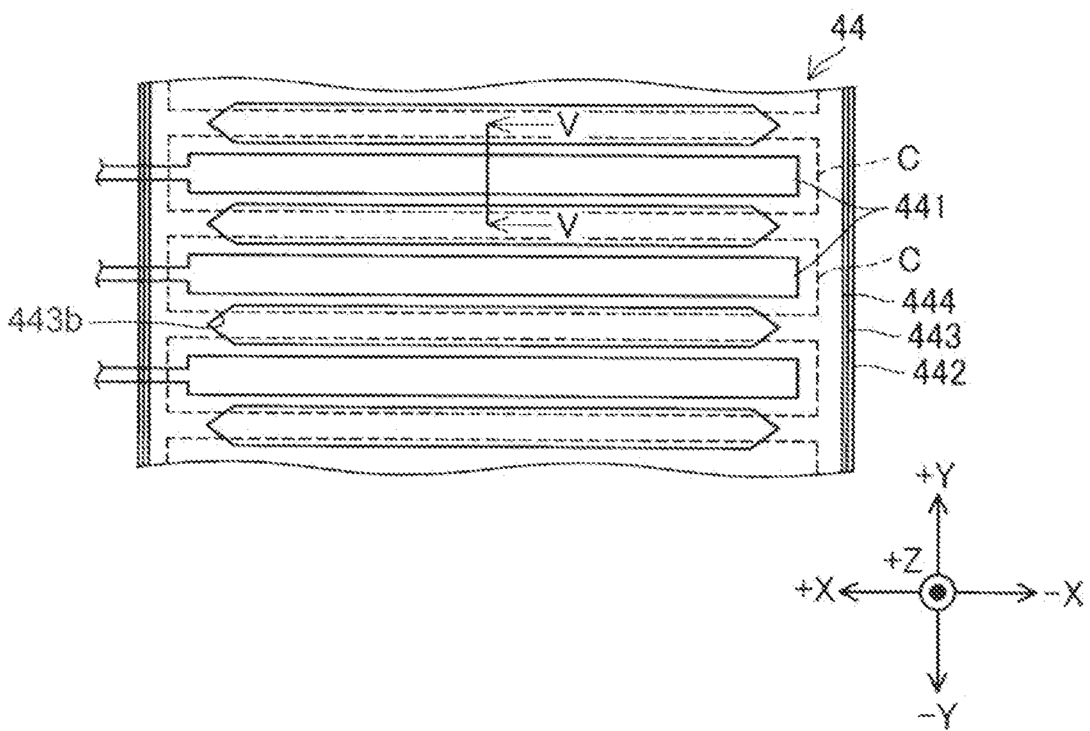
FIG. 4 is a plan view of a piezoelectric element.
Figure 5:
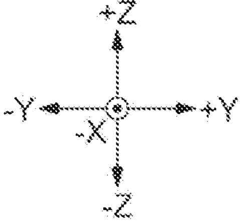
FIG. 5 is a cross-sectional view taken along a line V-V in FIG. 4.

Next, a configuration of the piezoelectric element 44 will be described with reference to FIGS. 4 and 5. FIG. 4 is a plan view of the piezoelectric element 44. FIG. 5 is a cross-sectional view taken along a line V-V in FIG. 4.

As shown in FIG. 4, the piezoelectric element 44 is provided to overlap the plurality of pressure chambers C arranged in the Y-direction in a plan view. The piezoelectric element 44 includes first electrodes 441, a seed layer 442 as the orientation control layer, a piezoelectric body 443, and a second electrode 444.

The first electrodes 441 are provided in one-to-one correspondence with the pressure chambers C. The first electrode 441 is coupled to a wiring drawn out in a +X-direction, and is electrically coupled to the drive circuit 50 via the bump B.

The piezoelectric body 443 has a through hole 443*b* in which the piezoelectric body 443 is not provided between two adjacent first electrodes 441.

FIG. 5 shows a cross-sectional configuration of the piezoelectric element 44 provided corresponding to one pressure chamber C. As shown in FIG. 5, the piezoelectric element 44 is provided at a position overlapping the pressure chamber C on the vibration plate 36.

The vibration plate 36 includes a silicon substrate 361 and an insulator layer 362.

The piezoelectric element 44 has a structure in which the first electrode 441, the seed layer 442, the piezoelectric body 443, and the second electrode 444 are stacked in this order on the vibration plate 36. Here, in the piezoelectric element 44, a portion where the first electrode 441, the seed layer 442, the piezoelectric body 443, and the second electrode 444 overlap in the Z-direction is referred to as an active portion 440. The active portion 440 is a portion where the piezoelectric body 443 is deformed when a voltage is applied between the first electrode 441 and the second electrode 444.

The insulator layer 362 is made of a zirconium oxide ($ZrO_2$).

The first electrode 441 includes a titanium (Ti) layer and a platinum (Pt) layer. The first electrode 441 is not limited to a plurality of layers of the Ti layer and the Pt layer, and may be, for example, a single layer of metal materials such as Ti, Pt, iridium (Ir), aluminum (Al), nickel (Ni), gold (Au), and copper (Cu), or may be formed by stacking the plurality of layers of these metal materials.

The seed layer 442 functions as the orientation control layer for controlling an orientation of the piezoelectric body 443 in a step of forming the piezoelectric body 443 to be described later.

As a material of the seed layer 442, for example, a polycrystalline nickel lanthanum oxide ($LaNiO_3$), a composite oxide having a perovskite structure, in which an A site contains bismuth (Bi), a B site contains iron (Fe) and titanium (Ti), and which is self-oriented in a (100) plane, or bismuth manganate can be used.

A lead-free piezoelectric material is preferably used as the material of the piezoelectric body 443.

As the lead-free piezoelectric material, for example, bismuth ferrate ($BiFeO_3$), barium titanate ($BaTiO_3$), potassium lithium niobate ($(K,Na,Li)NbO_3$), potassium lithium tantalate niobate ($(K,Na,Li)(Nb,Ta)O_3$), bismuth potassium titanate ($(Bi_{1/2}K_{1/2})TiO_3$), bismuth sodium titanate ($(Bi_{1/2}Na_{1/2})TiO_3$), bismuth manganate ($BiMnO_3$), a composite oxide ($(Bi,K)(Ti,Fe)O_3$) containing bismuth (Bi), K, Ti and iron (Fe), a composite oxide ($(Bi,Ba)(Fe,Ti)O_3$) containing Bi, Fe, barium (Ba) and Ti, or a composite oxide ($(Bi,Ba)(Fe,Ti,M)O_3$) obtained by adding a metal such as Mn, cobalt (Co) and chromium (Cr) to the above-described composite oxide (M is Mn, Co or Cr) can be used.

The second electrode 444 is made of Ir. The second electrode 444 is not limited to Ir, and may be, for example, a single layer of metal materials such as Pt, Al, Ni, Au, and Cu, or may be formed by stacking a plurality of layers of these metal materials.

The second electrode 444 is provided in common to the plurality of active portions 440.

An individual voltage is applied as a drive signal from the drive circuit 50 to the first electrode 441 for each active portion 440, and a reference voltage is applied as a common voltage to the plurality of active portions 440 from the drive circuit 50 to the second electrode 444.

4. Configuration of First Electrode

Figure 6:
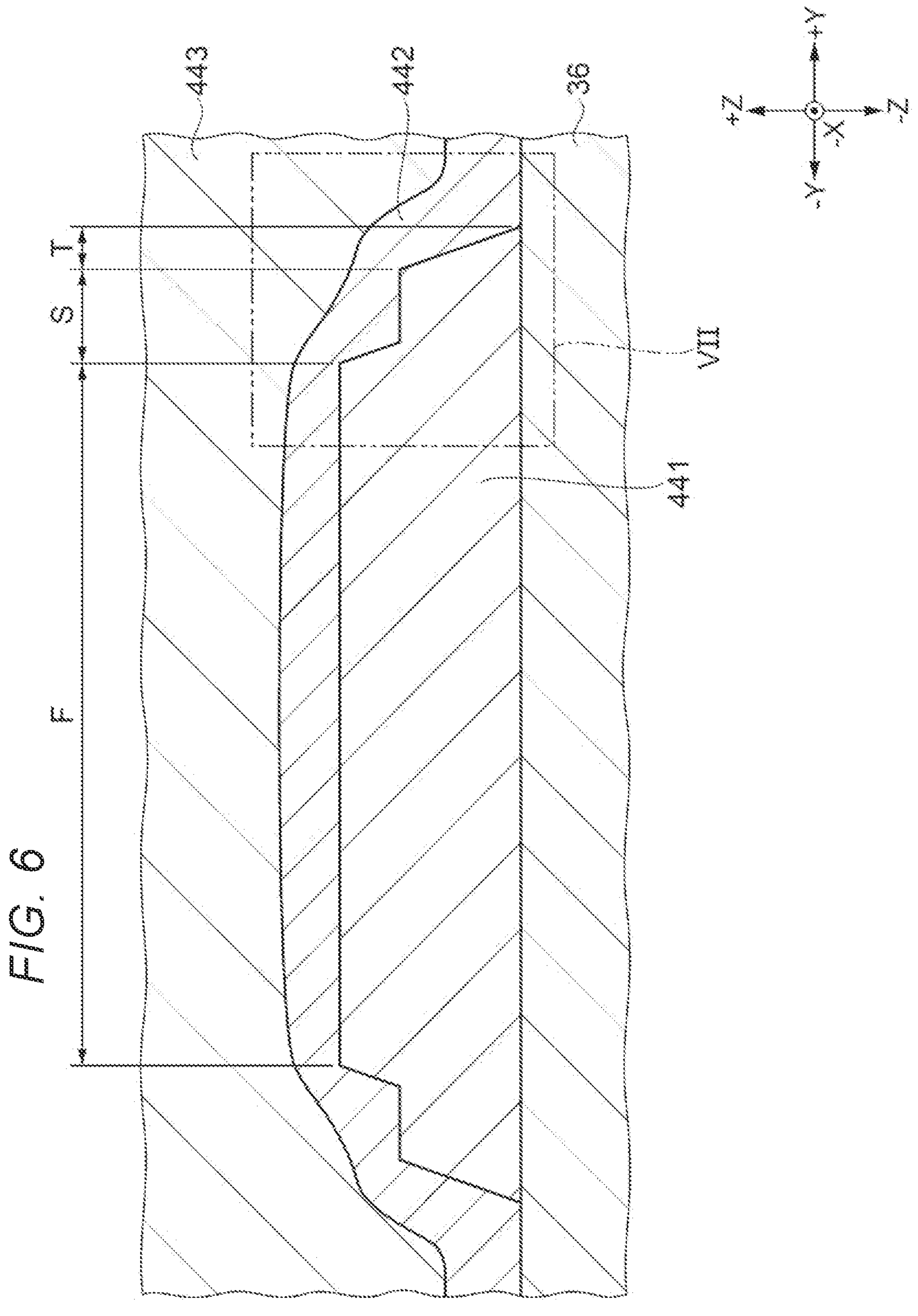
FIG. 6 is an enlarged cross-sectional view of a region VI in FIG. 5.
Figure 7:
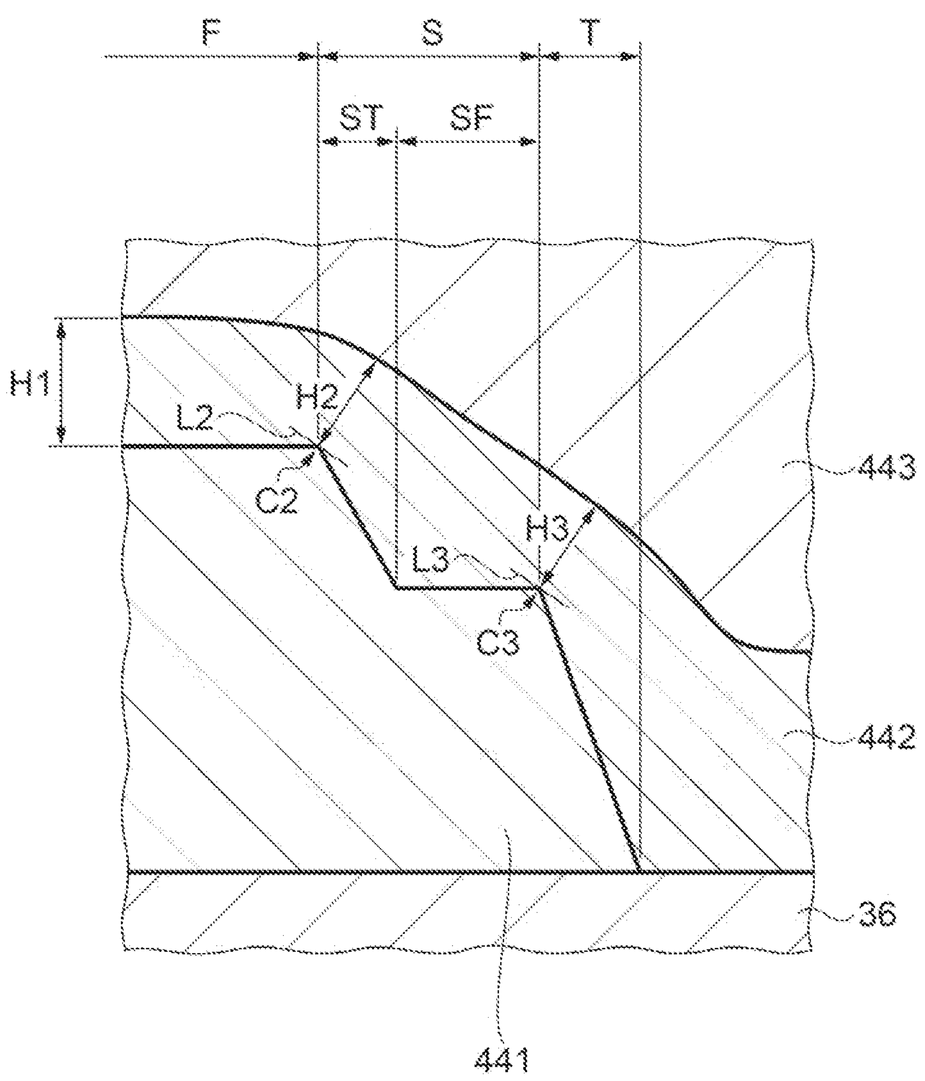
FIG. 7 is an enlarged cross-sectional view of a region VII in FIG. 6.
Figure 7:
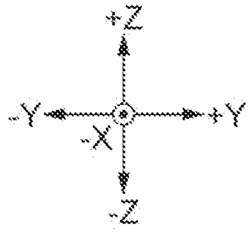
Figure 8:
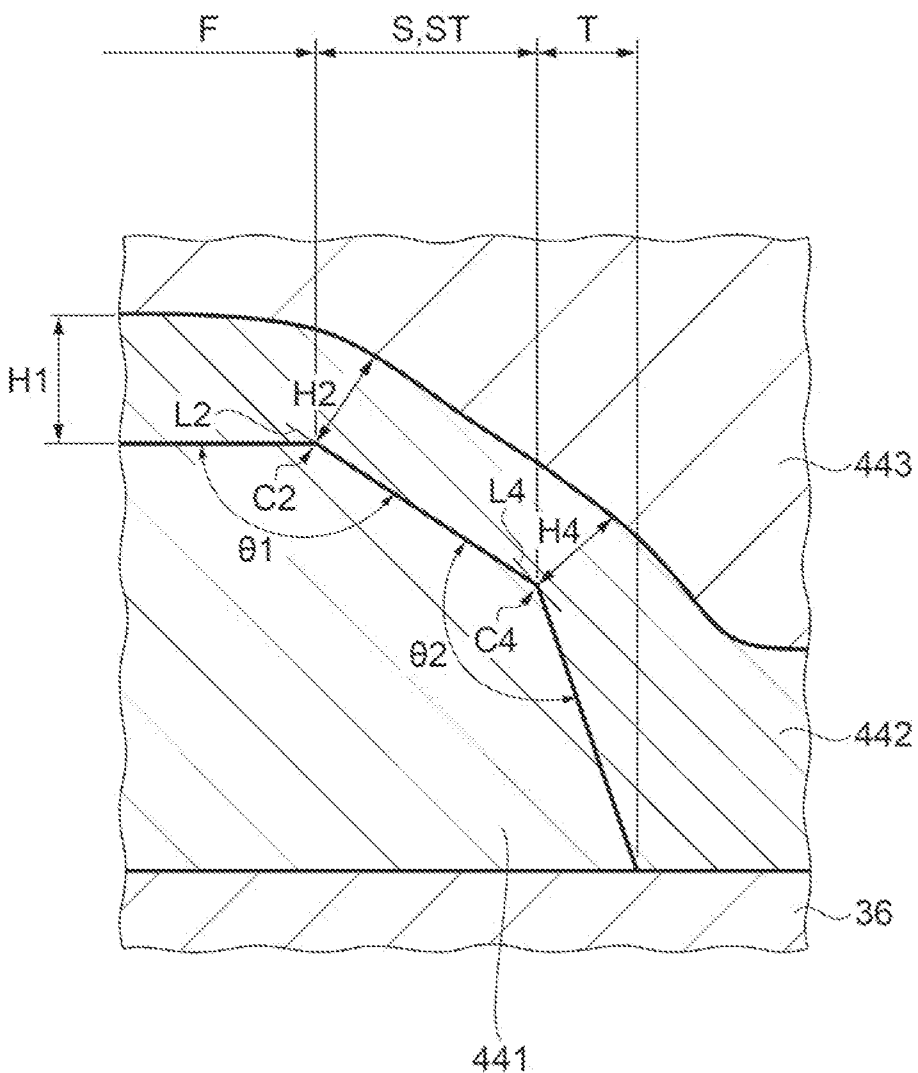
FIG. 8 is an enlarged cross-sectional view of a first electrode according to a second embodiment of FIG. 7.
Figure 8:
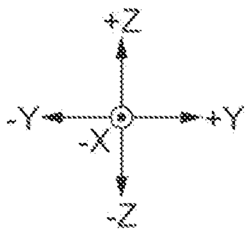

Next, the configuration of the first electrode 441 of the piezoelectric element 44 will be described with reference to FIGS. 6 to 8. FIGS. 6 and 7 show the first electrode 441 according to a first embodiment. FIG. 8 shows the first electrode 441 according to a second embodiment.

4A. First Embodiment

FIG. 6 is an enlarged cross-sectional view of a region VI indicated by a two-dot chain line in FIG. 5. FIG. 7 is an enlarged cross-sectional view of a region VII indicated by a two-dot chain line in FIG. 6.

As shown in FIG. 6, the first electrode 441 according to the first embodiment has step-shaped steps at both ends thereof in the Y-direction, and has a shape in which two trapezoids are stacked in two stages in an up-down direction in a cross-sectional view.

The first electrode 441 has a flat region F corresponding to an upper base of the upper trapezoid, an inclined region T corresponding to an oblique side of the lower trapezoid, and a step region S as a step between the flat region F and the inclined region T.

As shown in FIG. 7, the step region S further includes a sub-inclined region ST corresponding to an oblique side of the upper trapezoid and a sub-flat region SF corresponding to an upper base of the lower trapezoid.

In layer thicknesses of the seed layer 442 provided on the first electrode 441, when a thickness of the flat region F in a normal direction is defined as a thickness H1, a thickness of a corner portion C2 between the flat region F and the sub-inclined region ST in the normal direction is defined as a thickness H2, and a thickness of a corner portion C3 between the sub-flat region SF and the inclined region T in the normal direction is defined as a thickness H3, the thickness H2 of the corner portion C2 is thinner than the thickness H1 of the flat region F. Similarly, the thickness H3 of the corner portion C3 is thinner than the thickness H1 of the flat region F.

In the layer thicknesses of the seed layer 442, the thickness H2 is a thickness in a direction perpendicular to a tangent line L2 in contact with the corner portion C2 between the flat region F and the sub-inclined region ST, and the thickness H3 is a thickness in a direction perpendicular to a tangent line L3 in contact with the corner portion C3 between the sub-flat region SF and the inclined region T.

The reason why the film thicknesses of the seed layer 442 are thinner at the corner portion C2 and the corner portion C3 than in the flat region F is that the seed layer 442 is formed by a liquid phase method.

As the liquid phase method, in the embodiment, a solution method of forming the seed layer 442 from a precursor solution is used.

In the solution method, the precursor solution of the seed layer 442 is spin-coated on the first electrode 441. The precursor solution of the spin-coated seed layer 442 easily flows at the corner portions of the ends of the first electrode 441 due to the fluidity of the precursor solution, and a liquid film of the precursor solution is thin at the corner portions of the first electrode 441. Thereafter, the film thicknesses of the seed layer 442 formed by firing in a heating furnace are also thin at the corner portions of the first electrode 441.

In the embodiment, the step region S is provided in the first electrode 441 so that the liquid film of the precursor solution of the seed layer 442 does not become too thin at the corner portions of the ends of the first electrode 441.

Therefore, according to the configuration in the first embodiment, it is possible to prevent the liquid film of the precursor solution of the seed layer 442 from being excessively thin at the corner portions C2 and C3 of the first electrode 441.

Therefore, it is possible to avoid the occurrence of a defect that the seed layer 442 is not formed and is broken, or the film thickness of the seed layer 442 is too thin that the seed layer 442 cannot function as an orientation control layer.

In the embodiment, since the defect of the seed layer 442 is prevented, the occurrence of the defect of the piezoelectric body 443 caused by the defect of the seed layer 442 is also prevented.

Therefore, growth of the piezoelectric body 443 in an unintended crystal orientation and generation of cracks in the piezoelectric body 443 are prevented, and the piezoelectric body 443 having excellent piezoelectric characteristics can be provided.

In the embodiment, a configuration in which one set of the sub-inclined region ST and the sub-flat region SF is provided in the step region S is shown, and two or more sets of the sub-inclined region ST and the sub-flat region SF may be provided in the step region S. In other words, a plurality of steps may be provided in the step region S.

4B. Second Embodiment

FIG. 8 is an enlarged cross-sectional view of the first electrode 441 according to the second embodiment.

As shown in FIG. 8, in the first electrode 441 according to the second embodiment, the step region S includes only the sub-inclined region ST. An angle θ1 formed by the sub-inclined region ST and the flat region F of the first electrode 441 is smaller than an angle θ2 formed by the sub-inclined region ST and the inclined region T.

The sub-inclined region ST is provided such that the angle θ1 and the angle θ2 have the relationship as described above. In the sub-inclined region ST, a large number of sets of the sub-inclined region ST and the sub-flat region SF shown in the first embodiment are disposed in the step region S, in other words, a large number of step-shaped steps are disposed. Alternatively, the sub-inclined region ST may be an inclined shape.

The seed layer 442 is formed by a liquid phase method as in the first embodiment. Therefore, as for the film thicknesses of the seed layer 442, the thickness H2 of the corner portion C2 between the flat region F and the sub-inclined region ST in the normal direction is thinner than the thickness H1 of the flat region F in the normal direction. Similarly, as for the film thicknesses of the seed layer 442, a thickness H4 of a corner portion C4 between the sub-inclined region ST and the inclined region T in the normal direction is thinner than the thickness H1 of the flat region F in the normal direction.

The thickness H2 is a thickness in a direction perpendicular to the tangent line L2 in contact with the corner portion C2 between the flat region F and the sub-inclined region ST, and the thickness H4 is a thickness in a direction perpendicular to a tangent line L4 in contact with the corner portion C4 between the sub-inclined region ST and the inclined region T.

In the configuration of the second embodiment, similarly to the first embodiment, it is also possible to avoid the occurrence of a defect that the seed layer 442 is not formed and is broken, or the film thickness of the seed layer 442 is too thin that the seed layer 442 cannot function as an orientation control layer.

Therefore, similarly to the first embodiment, growth of the piezoelectric body 443 in an unintended crystal orientation and generation of cracks in the piezoelectric body 443 are prevented, and the piezoelectric body 443 having excellent piezoelectric characteristics can be provided.

5. Manufacturing Method of Piezoelectric Element

Figure 11:
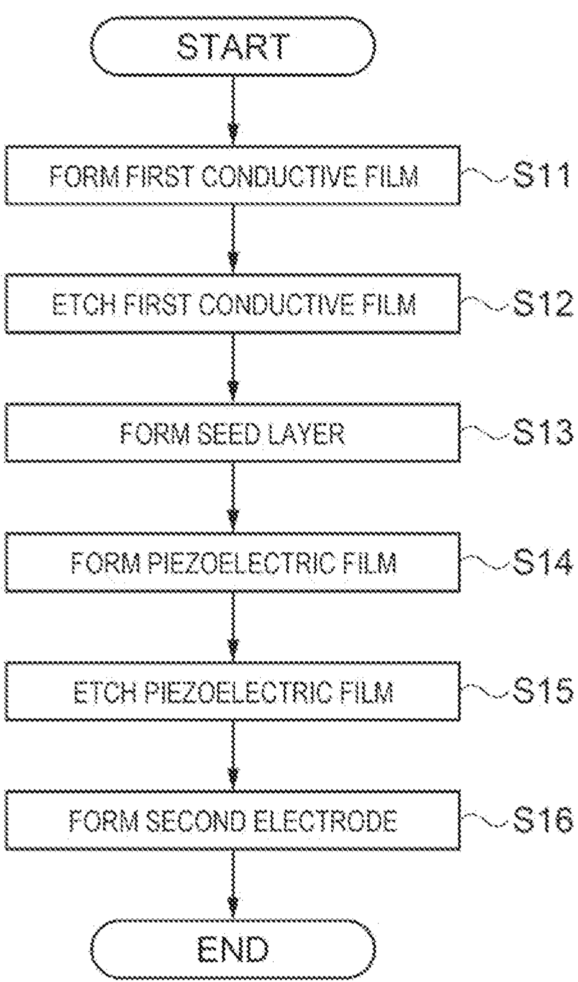
FIG. 11 is a flowchart according to a second manufacturing method of the piezoelectric element.
Figure 12:
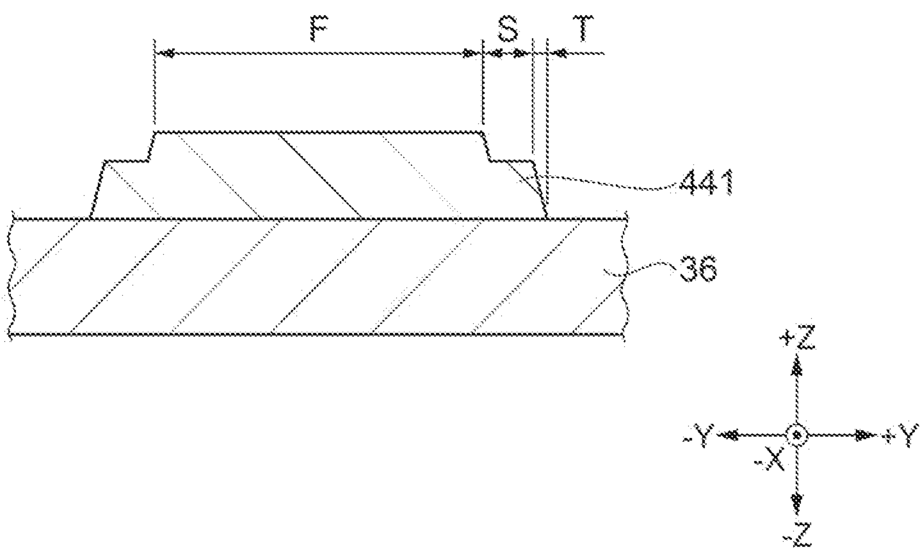
FIG. 12 is a cross-sectional view showing a step of the second manufacturing method.

Next, a manufacturing method of the piezoelectric element 44 will be described with reference to FIGS. 9 to 12. FIGS. 9 and 10A to 10H are diagrams showing a first manufacturing method. FIGS. 11 and 12 are diagrams showing a second manufacturing method.

5A. First Manufacturing Method

Figure 9:
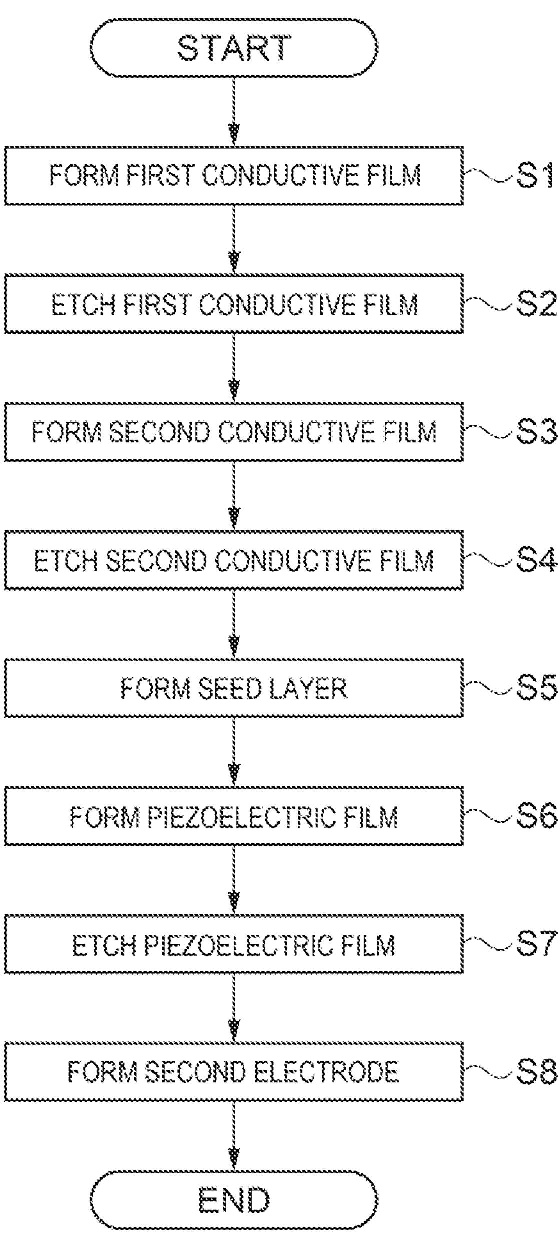
FIG. 9 is a flowchart according to a first manufacturing method of the piezoelectric element.

FIG. 9 is a flowchart according to the first manufacturing method of the piezoelectric element. FIGS. 10A to 10H are cross-sectional views each showing one step of the first manufacturing method.

Figure 10A:
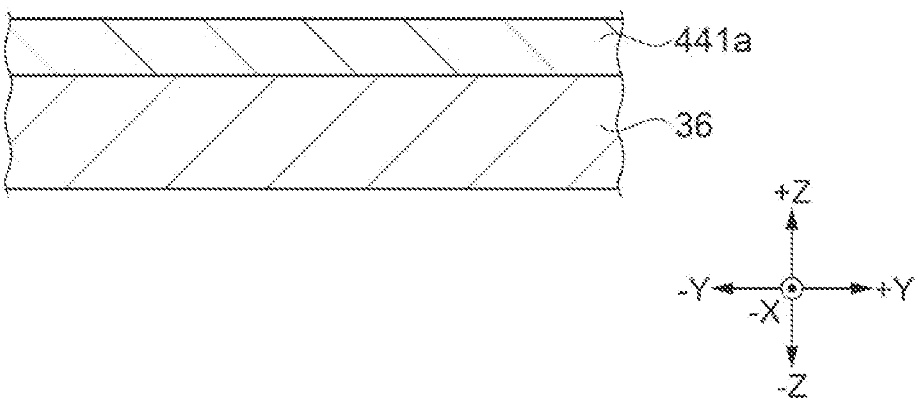
FIG. 10A is a cross-sectional view showing a step of the first manufacturing method.

In step S1, as shown in FIG. 10A, a first conductive film 441*a* constituting the first electrode 441 is formed on the vibration plate 36. For example, a sputtering method or a vapor deposition method can be used to form the first conductive film 441*a*.

Figure 10B:
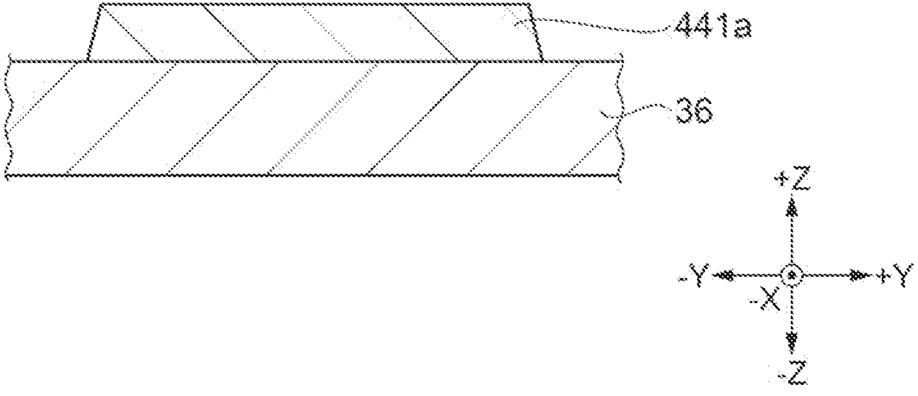
FIG. 10B is a cross-sectional view showing a step of the first manufacturing method.

In step S2, as shown in FIG. 10B, the first conductive film 441*a* is etched to pattern a portion corresponding to the lower trapezoid of the first electrode 441. A length of a lower base of the lower trapezoid of the first electrode 441, that is, a length in the Y-direction is, for example, 50 μm. Patterning of the first conductive film 441*a* may be performed by, for example, a photolithography method.

Figure 10C:
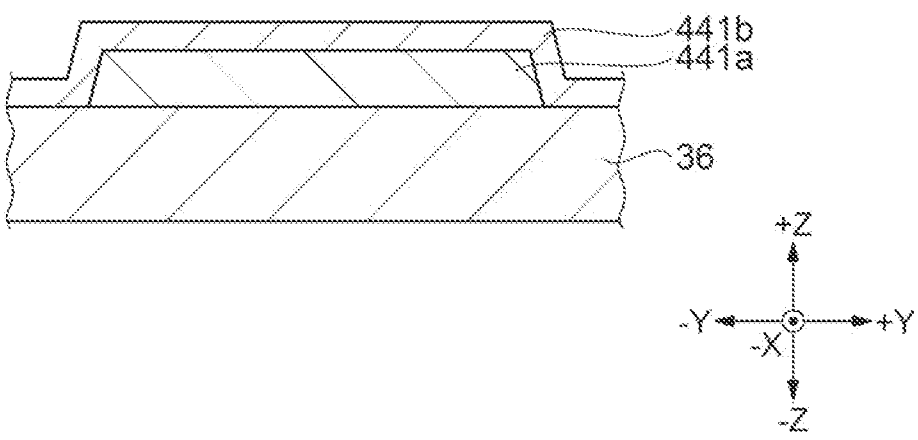
FIG. 10C is a cross-sectional view showing a step of the first manufacturing method.

In step S3, as shown in FIG. 10C, a second conductive film 441*b* is formed on the patterned first conductive film 441*a*.

Figure 10D:
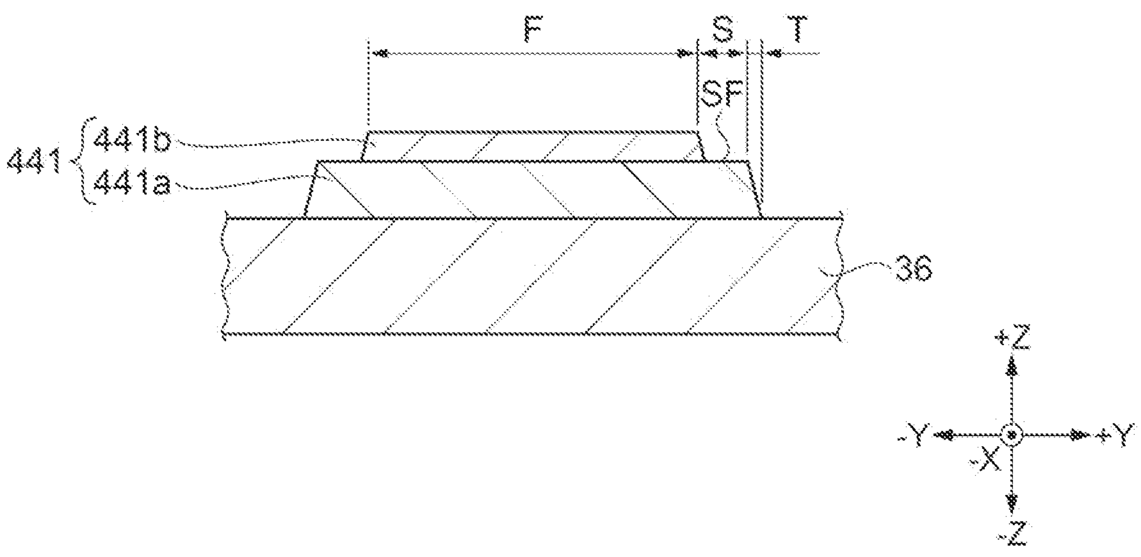
FIG. 10D is a cross-sectional view showing a step of the first manufacturing method.

In step S4, as shown in FIG. 10D, the second conductive film 441*b* is etched to pattern a portion corresponding to the upper trapezoid of the first electrode 441.

In step S4, the first electrode 441 having a two-layer structure of the first conductive film 441*a* and the second conductive film 441*b* is formed on the vibration plate 36. The first electrode 441 has the flat region F corresponding to the upper base in the second conductive film 441*b* corresponding to the upper trapezoid, the inclined region T corresponding to an oblique side in the first conductive film 441*a* corresponding to the lower trapezoid, and the step region S between the flat region F of the second conductive film 441*b* and the inclined region T of the first conductive film 441*a*.

A length of the step region S of the first electrode 441 in the Y-direction is about 50 nm. The film thickness of the first conductive film 441*a*, that is, the length in the Z-direction is about 50 nm, and the film thickness of the second conductive film 441*b* is about 50 nm. Therefore, the sub-flat region SF of the step region S is located at a height of about 50% of the film thickness of the first electrode 441. The sub-flat region SF may be located at a height of about 30 to 70% of the film thickness of the first electrode 441. When a plurality of steps are provided in the step region S, that is, when a plurality of sub-flat regions SF are provided in the step region S, each sub-flat region SF may be provided at a position having an appropriate height in the film thickness of the first electrode 441 according to the number of sub-flat regions SF.

Figure 10E:
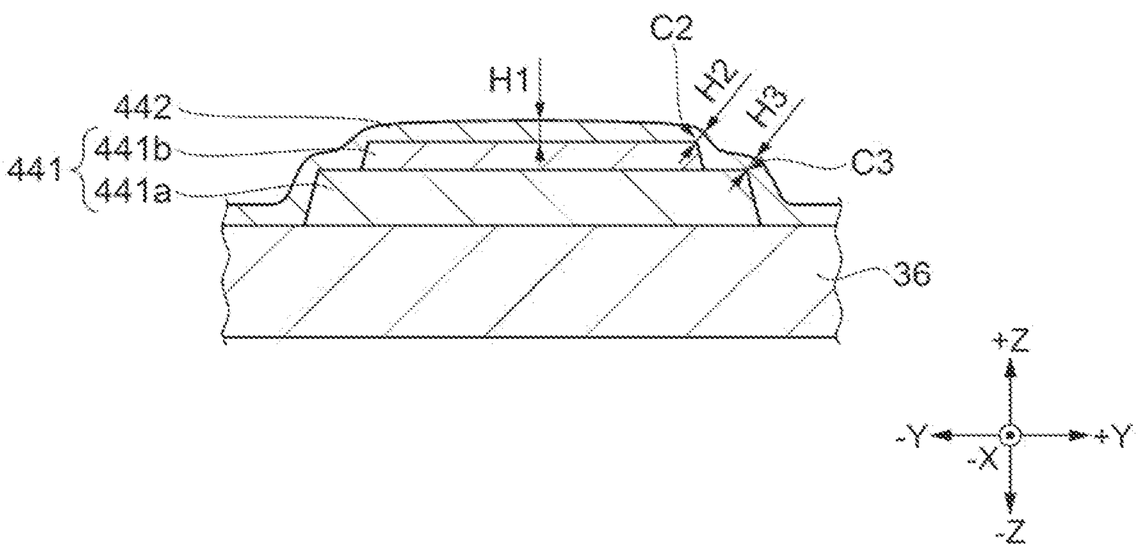
FIG. 10E is a cross-sectional view showing a step of the first manufacturing method.

In step S5, as shown in FIG. 10E, the seed layer 442 is formed on the first electrode 441 by the liquid phase method. In step S5, a precursor solution of the seed layer 442 (not shown) is spin-coated on the first electrode 441 to form a liquid film of the precursor solution on the first electrode 441. Thereafter, firing is performed in a heating furnace to form the seed layer 442.

As described above, as for the film thicknesses of the seed layer 442, the thickness H2 of the corner portion C2 is thinner than the thickness H1 of the flat region F. Similarly, as for the film thicknesses of the seed layer 442, the thickness H3 of the corner portion C3 is thinner than the thickness H1 of the flat region F.

However, since the first electrode 441 has the step region S between the flat region F and the inclined region T, it is possible to avoid that the seed layer 442 is not formed at the corner portions C2 and C3 of the first electrode 441. Further, the thicknesses H2 and H3 of the seed layer 442 can be prevented from being too thin that the seed layer 442 cannot function as the orientation control layer.

Figure 10F:
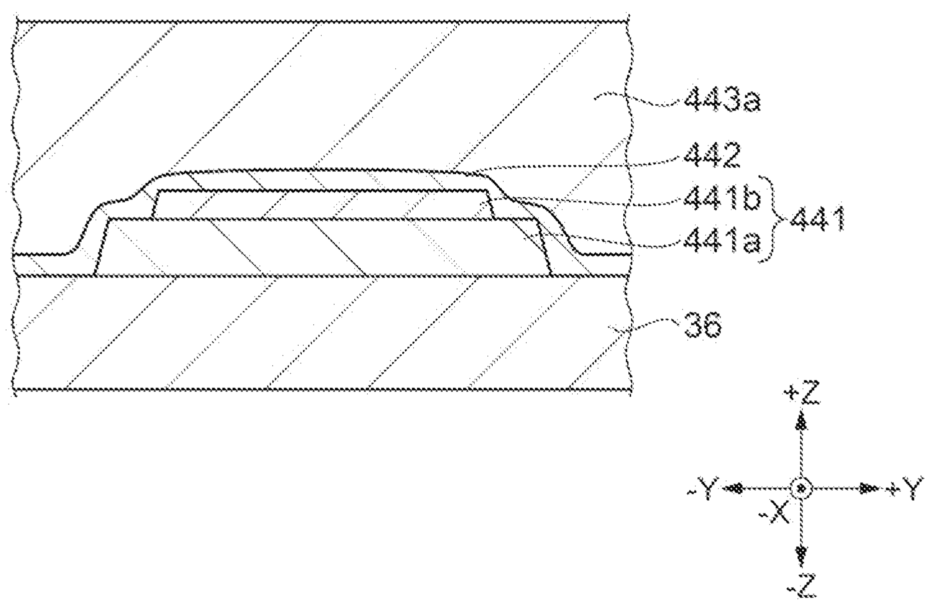
FIG. 10F is a cross-sectional view showing a step of the first manufacturing method.

In step S6, as shown in FIG. 10F, a piezoelectric film 443*a* constituting the piezoelectric body 443 is formed on the seed layer 442. The piezoelectric film 443*a* can be formed by a method same as that of the seed layer 442. The piezoelectric film 443*a* may be formed of a plurality of layers. The piezoelectric film 443*a* formed of the plurality of layers can be formed by repeating the steps from spin-coating to firing a plurality of times.

Figure 10G:
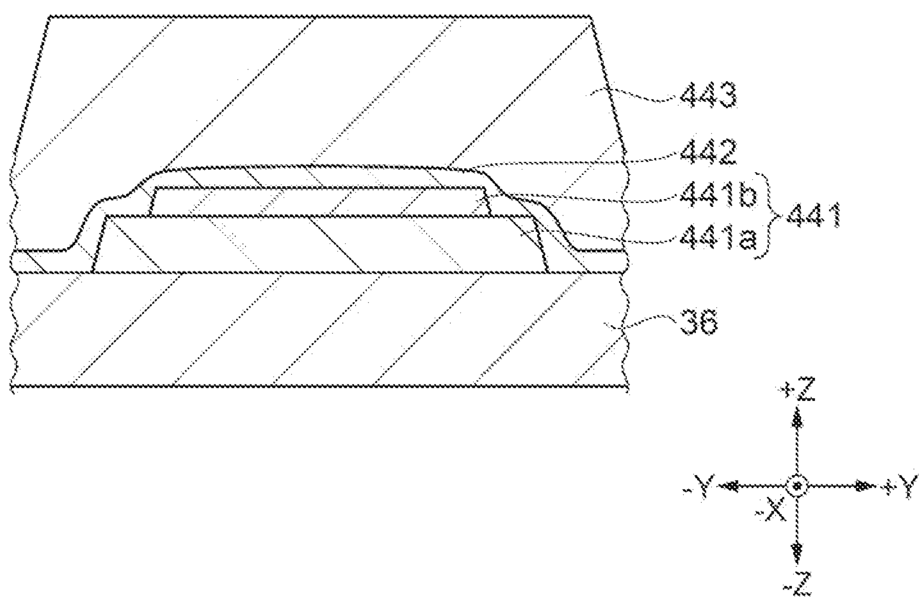
FIG. 10G is a cross-sectional view showing a step of the first manufacturing method.

In step S7, as shown in FIG. 10G, the piezoelectric film 443*a* is etched to form the piezoelectric body 443.

Figure 10H:
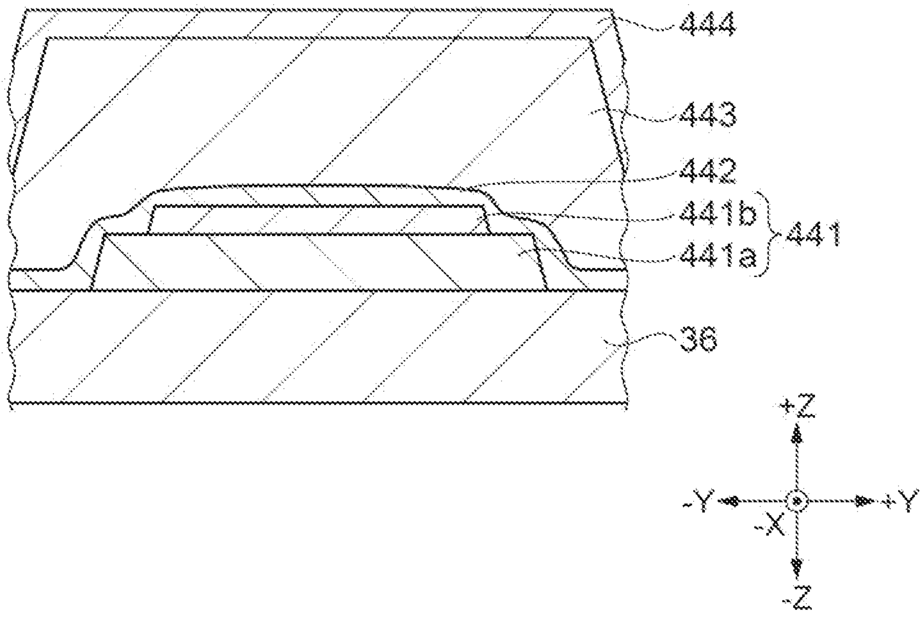
FIG. 10H is a cross-sectional view showing a step of the first manufacturing method.

In step S8, as shown in FIG. 10H, the second electrode 444 is formed on the piezoelectric body 443.

5B. Second Manufacturing Method

FIG. 11 is a flowchart according to the second manufacturing method of the piezoelectric element. FIG. 12 is a cross-sectional view showing one step of the second manufacturing method. In the second manufacturing method, the first conductive film 441*a* is etched to form the first electrode 441.

In step S11, the first conductive film 441*a* constituting the first electrode 441 is formed on the vibration plate 36.

In step S12, the first conductive film 441*a* is etched to pattern the first electrode 441 having steps at ends of the first conductive film 441*a*. In step S12, the first electrode 441 is patterned into a shape having the flat region F, the step region S, and the inclined region T as shown in FIG. 12.

Step S12 includes two steps. In the first step, the first conductive film 441*a* is patterned. In the second step, each end of the first electrode 441 is etched to form the step region S.

As described above, in the second manufacturing method, since there is no step of forming the second conductive film 441*b*, the first electrode 441 having the step region S can be formed in fewer steps than in the first manufacturing method.

In step S13, the seed layer 442 is formed on the first electrode 441 by the liquid phase method.

In step S14, the piezoelectric film 443*a* constituting the piezoelectric body 443 is formed on the seed layer 442.

In step S15, the piezoelectric film 443*a* is etched to form the piezoelectric body 443.

In step S16, the second electrode 444 is formed on the piezoelectric body 443.

5C. First Modification of Second Manufacturing Method

Next, a first modification of the second manufacturing method will be described.

In the first modification, in step S12 of the second manufacturing method, a photolithography method using a halftone mask is used. By using the halftone mask, resists having two types of thicknesses can be formed on the first conductive film 441*a*. Therefore, the first electrode 441 having the step region S can be patterned by etching once.

As described above, in the first modification of the second manufacturing method, since the step of etching the first conductive film 441*a* is completed only once, the first electrode 441 having the step region S can be formed with fewer steps than in the second manufacturing method.

5D. Second Modification of Second Manufacturing Method

Next, a second modification of the second manufacturing method will be described.

In the second modification, in step S12 of the second manufacturing method, a photolithography method using a gradation mask is used. By using the gradation mask, a resist having a tapered shape can be formed on the first conductive film 441*a*. Therefore, the first electrode 441 having the step region S as shown in FIG. 8 can be patterned by etching once.

As described above, in the second modification of the second manufacturing method, since the step of etching the first conductive film 441*a* is completed only once, the first electrode 441 having the step region S as shown in FIG. 8 can be formed with fewer steps than in the second manufacturing method.

As described above, according to the embodiment, the following effects can be obtained.

A manufacturing method of the piezoelectric element 44 according to an aspect of the present disclosure includes: forming the first conductive film 441*a* on the vibration plate 36 as a substrate; etching the first conductive film 441*a*; forming the second conductive film 441*b* on the first conductive film 441*a*; etching the second conductive film 441*b* to form the first electrode 441 having the step region S as a step formed by the second conductive film 441*b* and the first conductive film 441*a* at ends thereof; forming the seed layer 442 as an orientation control layer covering the first electrode 441 by a liquid phase method; forming the piezoelectric film 443*a* on the seed layer 442; etching the piezoelectric film 443*a* to form the piezoelectric body 443; and forming the second electrode 444 covering the piezoelectric body 443.

As described above, in the embodiments, the manufacturing method of the piezoelectric element 44 includes a step of providing the first electrode 441 having the step region S.

Therefore, in the step of forming the seed layer 442 by the liquid phase method, it is possible to prevent the liquid film of the precursor solution of the seed layer 442 from being too thin at the corner portions C2 and C3 of the first electrode 441. Therefore, it is possible to avoid the occurrence of the defect that the seed layer 442 is not formed and is broken, or the film thickness of the seed layer 442 is too thin that the seed layer 442 cannot function as the orientation control layer.

In the embodiment, since the defect of the seed layer 442 is prevented, the occurrence of the defect of the piezoelectric body 443 caused by the defect of the seed layer 442 is also prevented in the step of forming the piezoelectric film 443*a*.

Therefore, growth of the piezoelectric body 443 in an unintended crystal orientation and generation of cracks in the piezoelectric body 443 are prevented, and the piezoelectric body 443 having excellent piezoelectric characteristics can be provided.

A manufacturing method of the piezoelectric element 44 according to an aspect of the present disclosure includes: forming the first conductive film 441*a* on the vibration plate 36 as a substrate; forming the first electrode 441 by etching the first conductive film 441*a* to have a step region S as a step at an end of the first conductive film 441*a*; forming the seed layer 442 as an orientation control layer covering the first electrode 441; forming the piezoelectric film 443*a* on the seed layer 442; etching the piezoelectric film 443*a* to form the piezoelectric body 443; and forming the second electrode 444 covering the piezoelectric body 443.

As described above, in the embodiments, the manufacturing method of the piezoelectric element 44 includes a step of providing the first electrode 441 having the step region S.

Therefore, in the step of forming the seed layer 442, it is possible to avoid the occurrence of the defect that the seed layer 442 is not formed and is broken at the corner portions C2 and C3 of the first electrode 441, or the film thickness of the seed layer 442 is too thin that the seed layer 442 cannot function as the orientation control layer.

In the embodiment, since the defect of the seed layer 442 is prevented, the occurrence of the defect of the piezoelectric body 443 caused by the defect of the seed layer 442 is also prevented in the step of forming the piezoelectric film 443*a*.

Therefore, growth of the piezoelectric body 443 in an unintended crystal orientation and generation of cracks in the piezoelectric body 443 are prevented, and the piezoelectric body 443 having excellent piezoelectric characteristics can be provided.

In the manufacturing method of the piezoelectric element 44 according to an aspect of the present disclosure, the step of forming the first electrode 441 further includes a step of patterning the first conductive film 441*a* and a step of forming a step in the first conductive film 441*a*.

Therefore, according to the manufacturing method of the piezoelectric element 44 in the embodiment, the first electrode 441 having the step region S can be formed by the first conductive film 441*a*. Therefore, it is possible to enjoy the effect of a reduction in manufacturing cost and a reduction in manufacturing time which are obtained by a reduction in the number of steps.

In the manufacturing method of the piezoelectric element 44 according to an aspect of the present disclosure, the step of forming the first electrode 441 further includes a step of forming a step in the first conductive film 441*a* using a halftone mask.

Therefore, according to the manufacturing method of the piezoelectric element 44 in the embodiment, the first electrode 441 having the step region S can be formed in a small number of steps. Therefore, it is possible to enjoy the effects of a reduction in manufacturing cost and a reduction in manufacturing time which are obtained by a reduction in the number of steps.

The piezoelectric element 44 according to an aspect of the present disclosure includes: the first electrode 441; the seed layer 442 as an orientation control layer provided on the first electrode 441; the piezoelectric body 443 provided on the seed layer 442 and containing potassium, sodium, and niobium; and the second electrode 444 provided on the piezoelectric body 443. The first electrode 441 has the flat region F and the inclined region T. The first electrode 441 has the step region S between the flat region F and the inclined region T.

In this way, the piezoelectric body 443 is made of a material containing potassium, sodium, and niobium. In other words, the piezoelectric body 443 is made of a lead-free piezoelectric material. Further, the first electrode 441 has the step region S between the flat region F and the inclined region T.

Therefore, even if the seed layer 442 is formed of the lead-free piezoelectric material, it is possible to avoid the occurrence of the defect that the seed layer 442 is not formed and is broken at the corner portions of the ends of the first electrode 441, or the film thickness of the seed layer 442 is too thin that the seed layer 442 cannot function as the orientation control layer.

In the embodiment, since the defect of the seed layer 442 is prevented, the occurrence of the defect of the piezoelectric body 443 caused by the defect of the seed layer 442 is also prevented.

Therefore, growth of the piezoelectric body 443 in an unintended crystal orientation and generation of cracks in the piezoelectric body 443 are prevented, and the piezoelectric body 443 having excellent piezoelectric characteristics can be provided.

In the piezoelectric element 44 according to an aspect of the present disclosure, the step region S of the first electrode 441 further includes the sub-inclined region ST and the sub-flat region SF, the sub-inclined region ST is disposed between the flat region F and the sub-flat region SF, and the sub-flat region SF is disposed between the sub-inclined region ST and the inclined region T.

Therefore, it is possible to avoid the occurrence of the defect that the seed layer 442 is not formed and is broken at the corner portions of the ends of the first electrode 441, or the film thickness of the seed layer 442 is too thin that the seed layer 442 cannot function as the orientation control layer.

Further, in the piezoelectric element 44 according to an aspect of the present disclosure, as for the film thicknesses of the seed layer 442 as the orientation control layer, the thickness H2 of the corner portion C2 between the flat region F and the sub-inclined region ST in the normal direction is thinner than the thickness H1 of the flat region F in the normal direction.

Therefore, it is possible to avoid the occurrence of the defect that the seed layer 442 is not formed and is broken at the corner portions of the ends of the first electrode 441, or the film thickness of the seed layer 442 is too thin that the seed layer 442 cannot function as the orientation control layer.

In the piezoelectric element 44 according to an aspect of the present disclosure, the step region S of the first electrode 441 further includes the sub-inclined region ST, and an angle θ1 formed by the sub-inclined region ST and the flat region F is smaller than an angle θ2 formed by the sub-inclined region ST and the inclined region T.

Therefore, it is possible to avoid the occurrence of the defect that the seed layer 442 is not formed and is broken at the corner portions of the ends of the first electrode 441, or the film thickness of the seed layer 442 is too thin that the seed layer 442 cannot function as the orientation control layer.

In the piezoelectric element 44 according to an aspect of the present disclosure, the thickness H1 of the flat region F of the first electrode 441 in the normal direction is thicker than the thickness H2 of the corner portion C2 between the flat region F and the sub-inclined region ST of the first electrode 441 in the normal direction.

Therefore, it is possible to avoid the occurrence of the defect that the seed layer 442 is not formed and is broken at the corner portions of the ends of the first electrode 441, or the film thickness of the seed layer 442 is too thin that the seed layer 442 cannot function as the orientation control layer.

The liquid droplet dispensing head 26 according to an aspect of the present disclosure includes the piezoelectric element 44 described above, the drive circuit 50 as a voltage application unit that applies a voltage to the piezoelectric element 44, the pressure chamber substrate 34 provided with the pressure chamber C whose volume is changed by the piezoelectric element 44, the flow path substrate 32 provided with the communication flow path 26*c* that communicates with the pressure chamber C, and the nozzle plate 62 provided with a nozzle N that communicates with the communication flow path 26*c*.

Since the liquid droplet dispensing head 26 includes the piezoelectric element 44 having excellent piezoelectric characteristics, the liquid droplet dispensing head 26 can have a high industrial utility value.

Although the present disclosure is described based on preferred embodiments, the present disclosure is not limited to the above-described embodiments. The configuration of each part of the present disclosure can be replaced with any configuration that exhibits the functions same as that of the above-described embodiments, and any configuration can be added.

What is claimed is:

1. A piezoelectric element comprising:

a first electrode;

an orientation control layer provided on the first electrode;

a piezoelectric body provided on the orientation control layer and containing potassium, sodium, and niobium; and a second electrode provided on the piezoelectric body, wherein the first electrode has a flat region and an inclined region, the first electrode has a step region between the flat region and the inclined region, the step region of the first electrode includes a sub-inclined region, and an angle formed by the sub-inclined region and the flat region is smaller than an angle formed by the sub-inclined region and the Inclined region.

2. The piezoelectric element according to claim 1, wherein the step region of the first electrode includes the sub-inclined region and a sub-flat region, the sub-inclined region is disposed between the flat region and the sub-flat region, and the sub-flat region is disposed between the sub-inclined region and the inclined region.

3. The piezoelectric element according to claim 2, wherein as for film thicknesses of the orientation control layer, a thickness of a corner portion between the flat region and the sub-inclined region in a normal direction is thinner than a thickness of the flat region in the normal direction.

4. The piezoelectric element according to claim 1, wherein a thickness of the flat region of the first electrode in a normal direction is thicker than a thickness of a corner portion between the flat region and the sub-inclined region of the first electrode in the normal direction.

5. A liquid droplet dispensing head comprising:

the piezoelectric element according to claim 1;

a voltage application unit configured to apply a voltage to the piezoelectric element;

a pressure chamber substrate provided with a pressure chamber whose volume is changed by the piezoelectric element;

a flow path substrate provided with a communication flow path communicating with the pressure chamber; and a nozzle plate provided with a nozzle communicating with the communication flow path.

6. A piezoelectric element comprising:

a first electrode;

an orientation control layer provided on the first electrode;

a piezoelectric body provided on the orientation control layer and containing potassium, sodium, and niobium; and a second electrode provided on the piezoelectric body, wherein the first electrode has a flat region and an inclined region, the first electrode has a step region between the flat region and the inclined region, the step region of the first electrode includes a sub-inclined region and a sub-flat region, the sub-inclined region is disposed between the flat region and the sub-flat region, and the sub-flat region is disposed between the sub-inclined region and the inclined region.

7. The piezoelectric element according to claim 6, wherein as for film thicknesses of the orientation control layer, a thickness of a corner portion between the flat region and the sub-inclined region in a normal direction is thinner than a thickness of the flat region in the normal direction.

8. The piezoelectric element according to claim 6, wherein a thickness of the flat region of the first electrode in a normal direction is thicker than a thickness of a corner portion between the flat region and the sub-inclined region of the first electrode in the normal direction.

9. A liquid droplet dispensing head comprising:

the piezoelectric element according to claim 6;

a voltage application unit configured to apply a voltage to the piezoelectric element;

a pressure chamber substrate provided with a pressure chamber whose volume is changed by the piezoelectric element;

a flow path substrate provided with a communication flow path communicating with the pressure chamber; and a nozzle plate provided with a nozzle communicating with the communication flow path.

* * * * *